United States Patent
Sumino et al.

[11] Patent Number: 6,086,990
[45] Date of Patent: *Jul. 11, 2000

[54] HIGH THERMAL CONDUCTIVITY SILICON NITRIDE CIRCUIT SUBSTRATE AND SEMICONDUCTOR DEVICE USING THE SAME

[75] Inventors: Hiroyasu Sumino, Tokyo; Akihiro Horiguchi; Mitsuo Kasori, both of Kanagawa-ken; Fumio Ueno, Tokyo, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/721,320

[22] Filed: Sep. 26, 1996

[30] Foreign Application Priority Data

Sep. 28, 1995 [JP] Japan ............ 7-250318
Mar. 25, 1996 [JP] Japan ............ 8-067689

[51] Int. Cl.$^7$ .................................. B32B 15/00
[52] U.S. Cl. .................. 428/336; 501/97; 228/122; 428/469; 428/472; 428/697; 428/698; 428/699; 428/701; 428/702
[58] Field of Search .............. 428/698, 699, 428/697, 701, 702, 469, 472, 336; 501/97; 228/122

[56] References Cited

U.S. PATENT DOCUMENTS

| | | | |
|---|---|---|---|
| 3,994,430 | 11/1976 | Cusano et al. | 228/122 |
| 4,540,462 | 9/1985 | Mizunoya et al. | 156/630 |
| 4,602,731 | 7/1986 | Dockus | 228/122 |
| 4,608,354 | 8/1986 | Avella et al. | 501/97 |
| 4,647,477 | 3/1987 | DeLuca | 228/209 |
| 4,849,292 | 7/1989 | Mizunoya et al. | 428/469 |
| 5,100,714 | 3/1992 | Zsamboky | 428/698 |
| 5,280,850 | 1/1994 | Horiguchi et al. | 228/122.1 |
| 5,399,536 | 3/1995 | Yamakawa et al. | 501/97 |

OTHER PUBLICATIONS

Tsuge and Nishida, "High Strength Hot–Pressed $Si_3N_4$ with Concurrent $Y_2O_3$ and $Al_2O_3$ Additions", Ceramic Bulletin, vol. 57, No. 4, 1978, pp. 424–431.

Tanaka et al, "Surface Characteristics of Metal Bondable Silicone Nitride Ceramics", Proc. of International Symposium on Ceramic Components for Engine, Japan, 1993, pp. 249–256.

*Primary Examiner*—Archene Turner
*Attorney, Agent, or Firm*—Foley & Lardner

[57] ABSTRACT

Disclosed are a high thermal conductivity silicon nitride circuit substrate which comprises a silicon nitride ceramic plate having a thermal conductivity at 25° C. of 60 W/m·K or more and a metal circuit plate joined to the silicon nitride ceramic plate through an intermediate layer containing oxygen and at least one element selected from the group consisting of titanium, zirconium, hafnium, niobium and aluminum, and a semiconductor device using the same.

8 Claims, 2 Drawing Sheets

HIGH THERMAL CONDUCTIVITY SILICON NITRIDE CIRCUIT SUBSTRATE AND SEMICONDUCTOR DEVICE USING THE SAME

BACKGROUND OF THE INVENTION

1. Field of the Invention

This invention relates to a silicon nitride circuit substrate and a semiconductor device using the same, particularly to a high thermal conductivity silicon nitride circuit substrate having improved mechanical strength and thermal cycle resistance and excellent radiation characteristic, and a semiconductor device using the same.

2. Prior Art

In recent years, as a ceramic plate which is one constitutional element of a circuit substrate, there has been reported a ceramic plate mainly comprising silicon nitride having not only high mechanical strength and heat resistance, but also high thermal conductivity in Japanese Provisional Patent Publication No. 135771/1994.

In the prior art, a direct joining method for joining a ceramic plate and a metal circuit plate without using a binding material such as a wax material. This method is a method in which an eutectic compound of components contained in a metal circuit plate or components of a metal circuit plate and a ceramic plate is generated by heating and the eutectic compound is used as an adhesive to effect joining.

This joining method is effective for oxide ceramics such as alumina, but it is not effective for nitride ceramics because the wettability of an eutectic liquid phase is extremely low, whereby the joining strength to a metal circuit plate is insufficient. Further, the present inventors have studied to clarify that among nitride ceramics, with respect to aluminum nitride (AlN), when a ceramic plate is subjected to heat treatment in oxygen-containing atmosphere such as air, an oxide layer ($Al_2O_3$) having good wettability to an eutectic liquid phase is formed on a surface thereof, but this method is not effective for a silicon nitride ceramic plate.

Therefore, when a silicon nitride ceramic plate and a metal circuit plate are joined by a conventional direct joining method, joining strength is lowered, and when a semiconductor element is actuated to impose repeated thermal cycles on a joined portion, cracks are generated on a ceramic plate in the vicinity of the joined portion to give a circuit substrate having low thermal cycle resistance.

SUMMARY OF THE INVENTION

The present invention has been made in order to solve the above problems in the prior art. An object of the present invention is to provide a high thermal conductivity silicon nitride circuit substrate having higher thermal conductivity, more excellent radiation property and also significantly improved thermal cycle resistance in addition to high strength characteristic inherently possessed by a sintered silicon nitride ceramic circuit plate, and also to provide a semiconductor device in which reliability to thermal cycle is improved by utilizing said silicon nitride substrate.

The present inventors have found that a circuit substrate and a semiconductor device both of which can satisfy all of mechanical strength, a toughness value, thermal cycle resistance and radiation property can be provided by joining a metal circuit plate to a silicon nitride ceramic plate having a thermal conductivity at 25° C. of 60 W/m·K or more through an intermediate layer containing oxygen and at least one element selected from titanium, zirconium, hafnium, niobium and aluminum.

The high thermal conductivity silicon nitride circuit substrate according to the present invention is formed in an integrally joined state by forming an intermediate layer containing oxygen and at least one element selected from Ti, Zr, Hf, Nb and Al elements on the surface of a high thermal conductivity silicon nitride ceramic plate in which thermal conductivity is significantly improved in addition of high strength and high toughness characteristic inherently possessed by a silicon nitride sintered body and directly joining a metal circuit plate to the intermediate layer. Therefore, in an assembly step, cracks by clamping of the circuit substrate are not generated, and a semiconductor device using the circuit substrate can be mass produced with a high production yield.

Since the toughness value of the silicon nitride substrate is high, fewer cracks are generated on the substrate by thermal cycle, whereby a semiconductor device in which thermal cycle resistance is significantly improved and durability and reliability are excellent can be provided.

Further, the mechanical strength of silicon nitride itself is excellent, so that when required mechanical strength characteristic is constant, the substrate can be made thinner as compared with other ceramic substrate. Since the thickness of the substrate can be reduced, thermal resistance can be made smaller. Required mechanical characteristics can be satisfied even by the substrate which is thinner than a conventional substrate, so that high density packaging of a circuit substrate can be carried out, and a semiconductor device can be downsized.

DESCRIPTION OF THE PREFERRED EMBODIMENTS

Figure 1:
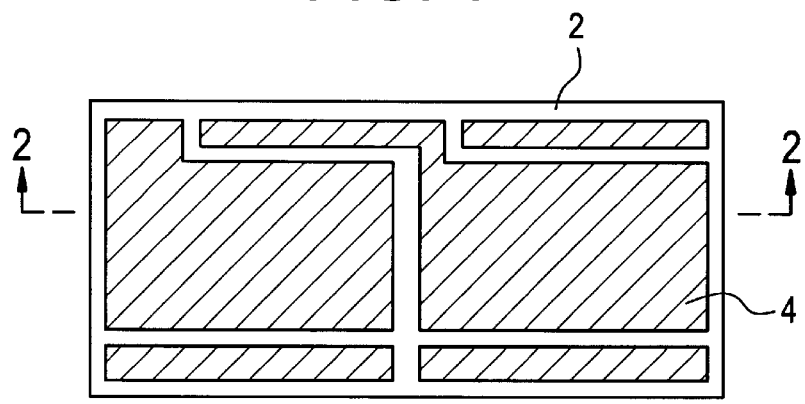
FIG. 1 is a plane view of the high thermal conductivity silicon nitride circuit substrate according to the present invention.
Figure 2:
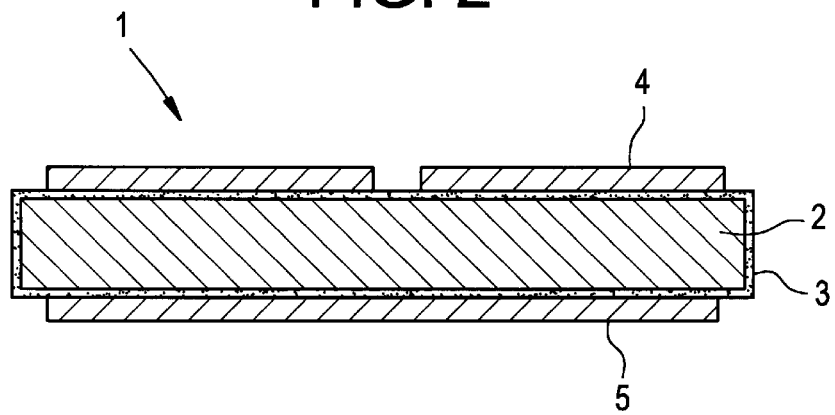
FIG. 2 is a sectional view cut along X—X of FIG. 1 of the high thermal conductivity silicon nitride circuit substrate according to the present invention.

First, the silicon nitride ceramic plate according to the present invention is explained.

The silicon nitride ceramic plate according to the present invention comprises silicon nitride as a matrix and, if necessary, contains, for example, a sintering aid such as a rare earth element. As a preferred embodiment, the silicon nitride ceramic plate contains a rare earth element in an amount of 1.0 to 12.5% by weight calculated on oxide and lithium, sodium, potassium, iron, calcium, magnesium, strontium, barium, manganese and boron in a total amount of 0.3% by weight or less as impurity cationic elements.

Structurally, the silicon nitride ceramic plate according to the present invention comprises silicon nitride particles and a grain boundary phase and preferably has a porosity of 1.5% by volume or less. In the grain boundary phase, preferably 20% by volume or more, more preferably 50% by volume or more of a crystalline compound phase exists based on the whole grain boundary phase.

The silicon nitride ceramic plate according to the present invention exhibits physical properties of a thermal conductivity of 60 W/m·K (at 25° C.) or more, preferably 80 W/m·K or more and a three point flexural strength at room temperature of 60 kgf/mm$^2$ or more, preferably 80 kgf/mm$^2$ or more.

The high thermal conductivity silicon nitride ceramic plate to be used in the present invention can be prepared by, for example, the following method. Predetermined amounts of necessary additives such as a sintering aid and an organic binder are added to silicon nitride powder having a fine particle size and a small impurity content, the mixture is stirred to prepare starting mixed powder, and then the starting mixed powder obtained is formed by using a sheet forming method such as a commonly used metal mold press method or doctor blade method to obtain a green body having a predetermined shape. The formed product is degreased at a predetermined temperature, for example, a highest temperature of 600 to 800° C. in non-oxidizing atmosphere, and the resulting degreased product is subjected to pressure sintering at a predetermined temperature for a predetermined time in inert gas atmosphere such as a nitrogen gas and an argon gas and then gradually cooled at a predetermined cooling rate to obtain a dense sintered body. If necessary, by subjecting the sintered body to grinding processing or the like, a high thermal conductivity silicon nitride ceramic plate having a predetermined shape can be obtained.

As the silicon nitride powder which is a main starting material of the high thermal conductivity silicon nitride ceramic plate according to the present invention, in consideration of sintering property, strength and thermal conductivity, fine silicon nitride powder having an oxygen content of 1.7% by weight or less, preferably 0.5 to 1.5% by weight, a content of impurity cationic elements of Li, Na, K, Fe, Mg, Ca, Sr, Ba, Mn, B and the like being 0.3% by weight or less, preferably 0.2% by weight or less, 90% by weight or more, preferably 93% by weight or more of α-phase silicon nitride having excellent sintering property and an average particle size of 0.8 μm or less, preferably about 0.4 to 0.6 μm is used.

By using the fine starting powder having an average particle size of 0.8 μm or less, even by a small amount of a sintering aid, a dense sintered body having a porosity of 1.5% by volume or less can be formed. The elements of Li, Na, K, Fe, Mg, Ca, Sr, Ba, Mn and B lower thermal conductivity as impurity cationic elements, so that in order to ensure a thermal conductivity of 60 W/m·K or more, it is necessary that the total content of the above impurity cationic elements is 0.3% by weight or less. Further, by using the silicon nitride starting powder containing 90% by weight or more of α-phase silicon nitride having excellent sintering property as compared with β-phase silicon nitride, a silicon nitride ceramic plate having high density and high thermal conductivity can be prepared.

As the rare earth element which is added to the silicon nitride starting powder as a sintering aid, there may be mentioned oxides of Y, La, Sc, Pr, Ce, Nd, Dy, Ho, Gd and the like, or compounds which become these oxides by heat treatment, for example, a carbonate, a nitrate, an oxalate and an alkoxide. These oxides and compounds may be added in combination of two or more, if necessary, but yttrium oxide ($Y_2O_3$) is particularly preferred. The above sintering aid is reacted with the silicon nitride starting powder in the course of a sintering step to produce a liquid phase and accelerates sintering thereby.

The amount of the above sintering aid to be added is set to the range of 1.0 to 12.5% by weight calculated on oxide based on the amount of the starting powder. If the amount to be added is less than 1.0% by weight, an effect of accelerating sintering is not exhibited sufficiently, while if the amount to be added exceeds 12.5% by weight, an excess grain boundary phase is produced, which might result in lowering thermal conductivity and mechanical strength. It is more preferred that the amount is in the range of 3.0 to 6.0% by weight.

Further, when at least one of alumina ($Al_2O_3$) and aluminum nitride is added as other component, alumina and/or aluminum nitride is/are reacted with the above rare earth element to produce a liquid phase, whereby an effect of accelerating sintering can be obtained, and particularly when sintering is carried out under pressure, a remarkable effect can be exhibited. If the total amount of these components to be added is less than 0.1% by weight, density is insufficient, while if it exceeds 2.0% by weight, an excess grain boundary phase is produced, or solid solution of a part of aluminum atoms in silicon nitride is started to cause lowering of thermal conductivity. Therefore, it is desired that the amount to be added is set to the range of 0.1 to 2.0% by weight, preferably the range of 0.2 to 1.5% by weight.

As other component, an oxide, a carbide, a nitride, a silicide, a boride and the like of Ti, Zr, Hf, V, Nb, Ta, Cr, Mo and W may be added. These compounds function to strengthen dispersion in a crystalline structure and improve mechanical strength of the silicon nitride substrate. If the amount of the above compound to be added is less than 0.2% by weight, an effect of improving strength is small, while if it exceeds 3.0% by weight, lowering of thermal conductivity and dielectric breakdown strength is brought about. Therefore, it is desired that the amount to be added is set to the range of 0.2 to 3.0% by weight, preferably the range of 0.3 to 2.0% by weight.

Further, the above compound such as Ti, Zr and Hf also functions as a light screen material which colors the silicon nitride ceramic plate and imparts opacity thereto. For this reason, particularly when the silicon nitride ceramic plate is applied to a circuit substrate in which an integrated circuit or the like in which malfunction is easily caused by light is mounted, it is desired to add the above compound.

In order to make the porosity of the silicon nitride ceramic plate 1.5% by volume or less and make the grain boundary phase formed in a silicon nitride sintered body comprise 20% by volume or more of a crystalline phase, it is necessary that a silicon nitride formed product is sintered under pressure at a temperature of 1,800 to 2,000° C. for about 0.5 to 10 hours, and the cooling rate after completion of sintering is regulated and controlled to 100° C. or less per hour, preferably 50° C. or less per hour. When the sintering temperature is set to lower than 1,800° C., the density of the sintered body is insufficient to lower mechanical strength and thermal conductivity. On the other hand, if the sintering temperature exceeds 2,000° C., decomposition and evaporation of silicon nitride become severe undesirably.

The cooling rate after sintering is an important factor for crystallizing the grain boundary phase and also for obtaining high mechanical strength and thermal conductivity. When such rapid cooling that the cooling rate exceeds 100° C. per hour is carried out, the rate of an amorphous phase (a non-crystalline phase) contained in the grain boundary phase in the inner portion of the sintered body becomes large to lower strength and thermal conductivity.

The temperature range to which the above cooling rate is regulated strictly is in the range of a predetermined sintering temperature (1,800 to 2,000° C.) to a temperature at which a liquid phase produced by the reaction of the above sintering aid is solidified. For example, the liquid phase-solidifying temperature in the case of using the sintering aid as described above is about 1,500 to 1,600° C. By controlling the cooling rate in the range of the sintering temperature to the liquid phase-solidifying temperature to 100° C. or less per hour, preferably 50° C. or less per hour, 20% by volume or more, desirably 50% by volume or more of the grain boundary phase becomes a crystalline phase, whereby a silicon nitride ceramic plate having excellent mechanical strength and thermal conductivity can be obtained.

Next, the intermediate layer containing oxygen and at least one element selected from the group consisting of titanium, zirconium, hafnium, niobium and aluminum according to the present invention is explained.

As the intermediate layer containing oxygen and at least one element selected from the group consisting of titanium, zirconium, hafnium, niobium and aluminum, there may be mentioned, for example, oxides of the above elements and compounds such as aluminate and silicate, and for example, as the intermediate layer containing aluminum, there may be mentioned compounds such as $Al_2O_3$, mullite ($Al_2O_3$—$SiO_2$), rare earth aluminate and SIALON. Further, an amorphous layer such as glass or the like containing these metal elements is also suitable. The elements and oxygen contained in the intermediate layer improves the wettability of the eutectic liquid phase of the metal circuit plate, and simultaneously therewith, a compound comprising the metal elements contained in the intermediate layer and metal circuit plate-constituting elements-oxygen is produced to join the metal circuit plate and the intermediate layer firmly, and further the intermediate layer and the silicon nitride ceramic plate can be also joined firmly. It has been found that particularly when the metal circuit plate mainly comprises aluminum and the intermediate layer contains aluminum, aluminum of the metal circuit plate and aluminum contained in the intermediate layer are diffused mutually to be joined firmly.

It is preferred that the thickness of the intermediate layer is set to the range of 0.5 to 10 $\mu$m. If it is set to the above range, the wettability of the above eutectic liquid phase is more improved, there is almost no problem in the thermal resistance of the intermediate layer, and also a difference in thermal expansion coefficient between the intermediate layer and the silicon nitride ceramic plate can be reduced easily. It is particularly preferred that the thickness is set to the range of 1 to 5 $\mu$m.

The above intermediate layer is formed on the surface of the silicon nitride ceramic plate after sintering, by various methods. There may be mentioned a method in which a homogeneous film which becomes a precursor is formed by a sol-gel method, a dipping method or a spin coating method and the film is subjected to heat treatment to prepare an intermediate layer of a desired compound or a method in which a compound layer which becomes an intermediate layer directly is formed by a CVD method, a PVD method or the like. In the case of glass or the like containing the above element, a method in which fine powder of the glass is made into a paste, the paste is coated homogeneously on the silicon nitride ceramic plate and heated to be melted can be also carried out. Further, in order to heighten the joining strength of the intermediate layer and the silicon nitride ceramic layer, heat treatment may be carried out after the intermediate layer has been formed. Conditions such as temperature and atmosphere of the heat treatment are selected in consideration of the characteristics of the intermediate layer. It is preferred that the temperature is 800° C. or more and the atmosphere is an air.

Further, a means for forming the intermediate layer can be taken previously when the silicon nitride ceramic plate is prepared. That is, in a stage of preparing a degreased product in the step of preparing the silicon nitride ceramic plate, the above degreased product is impregnated with, for example, an alkoxide solution containing titanium, zirconium, hafnium, niobium or aluminum to give a state that an excess amount of the above metal exists only in the vicinity of the surface of the degreased product, and the degreased product is sintered to prepare a silicon nitride ceramic plate containing an excess amount of the above metal on the surface. Next, the silicon nitride ceramic surface is subjected to heat treatment in atmosphere containing oxygen to form a desired intermediate layer, and a metal circuit plate is joined to the intermediate layer.

For example, when the above treatment is carried out by using an alkoxide solution containing aluminum, a surface layer of an oxide such as a $Al_2O_3$ or $SiO_2$—$Al_2O_3$ compound, SIALON or the like which becomes the intermediate layer is formed on the surface of the silicon nitride ceramic plate.

Next, the metal circuit plate according to the present invention is explained.

A metal which can be the metal circuit plate is not particularly limited so long as it is a simple substance of copper (Cu), aluminum (Al), iron (Fe), nickel (Ni), chromium (Cr), silver (Ag) or cobalt (Co), the above metal containing oxygen, an alloy of the above metals or the like which generates an eutectic liquid phase and can be joined. However, particularly from the point of conductivity and the point of price, Cu, Al and Ni (all of which may contain a certain amount of oxygen) and an alloy thereof are desired.

For example, in the case where the metal circuit plate is copper, the metal circuit plate is joined by the following method. That is, at a predetermined position of the surface of the high thermal conductivity silicon nitride ceramic plate on which the intermediate layer having a desired thickness and containing oxygen and at least one element selected from titanium, zirconium, hafnium, niobium and aluminum is formed, a copper circuit plate containing oxygen is arranged in a contacted state, the copper circuit plate is heated at an eutectic temperature (1,065° C.) or higher of copper and copper oxide ($Cu_2O$) and maintained for a certain time, if necessary, in a state that load is applied, to generate an eutectic liquid phase, and by using the liquid phase as a joining agent, the copper circuit plate is joined to the high thermal conductivity silicon nitride ceramic plate. Other kind of metal circuit plate can be also used, but in that case, it is necessary to set heat treatment temperature in consideration of the temperature at which the eutectic liquid phase is generated.

The semiconductor device according to the present invention is a device in which a semiconductor element(s) is mounted on the above high thermal conductivity silicon nitride circuit substrate. As a particularly representative example utilizing high thermal conductivity thereof, there may be mentioned semiconductor devices which are called power modules, in which a high output semiconductor element, for example, a bipolar transistor, Insulated Gate Bipolar Transistor (IGBT) or Giant Transistor (GTR) is mounted. These semiconductor devices are mainly used for controlling various motors, large electric power switching or the like. Although thermal cycle of heat evolution and cooling of the elements accompanied with driving and stopping of the semiconductor devices is imposed, the devices can cope with such thermal cycle sufficiently by high strength, high thermal conductivity and high reliability possessed by the above silicon nitride circuit substrate. Further, they can be also used for a package for mounting a semiconductor element(s).

EXAMPLES

The present invention is described in detail by referring to Examples. Examples are described for the purpose of facilitating understanding of the present invention, and the present invention is not particularly limited by Examples.

Example 1

To silicon nitride starting powder containing 1.3% by weight of oxygen and 0.15% by weight of impurity cationic elements, comprising 97% of α-phase type silicon nitride and having an average particle size of 0.55 µm, yttrium oxide ($Y_2O_3$) powder having an average particle size of 0.7 µm and alumina ($Al_2O_3$) powder having an average particle size of 0.6 µm as sintering aids were added in amounts of 5% by weight and 1.5% by weight based on the whole amount, respectively. The mixture was subjected to triturating in ethanol for 24 hours and then dried to prepare a starting mixed powder material. Next, an organic binder was added to the starting mixed powder material obtained, and the mixture was stirred and then subjected to press molding at a molding pressure of 1 t/cm² to prepare a green body having a size of 80×50×1 mm³. Next, after the green body obtained was degreased at a highest temperature of 700° C. in nitrogen gas, the resulting degreased product was sintered at 7.5 atmospheric pressure and 1,900° C. for 6 hours in nitrogen gas atmosphere and then cooled to 1,500° C. at a cooling rate of 100° C. per hour, and then furnace cooling was carried out to obtain a dense silicon nitride sintered body. The sintered body was subjected to grinding processing to obtain a silicon nitride ceramic plate having a thickness of 0.6 mm.

Next, an intermediate layer for joining was prepared by the following method. First, zirconium butoxide ($Zr(OBu)_4$) was dissolved in butanol which was a solvent, and water was diluted with the solvent so that no precipitate was formed in the solution and then added dropwise to the solution to effect partial hydrolysis. Thereafter, concentrated hydrochloric acid was diluted with the solvent and then added dropwise Lo the solution. The mixture was stirred and refluxed to prepare a coating solution. The above silicon nitride ceramic plate was dipped in the coating solution, pulled up at a rate of 1.5 cm/sec and dried. After the step of dipping and drying was repeated 10 times, the silicon nitride ceramic plate was held at 1,200° C. for 1 hour in the air to form a zirconia (ZrO2) layer having a thickness of 0.8 µm on the silicon nitride ceramic plate.

Next, on both sides of the silicon nitride ceramic plate on which the intermediate layers were formed, copper circuit plates comprising tough pitch copper having a thickness of 0.3 mm were arranged in a contacted state, and the plate was inserted into a belt type heating furnace and subjected to heat treatment at a highest temperature of 1,073° C. for 1 minute in nitrogen atmosphere to join the copper circuit plates to the silicon nitride ceramic plate, whereby a high thermal conductivity silicon nitride circuit substrate as shown in FIG. 1 was obtained. In FIG. 1, 2 is a silicon nitride ceramic plate, and 4 is a metal (Cu) circuit plate.

When the thermal conductivity of the silicon nitride circuit substrate obtained was measured, it was 80 W/m·K, porosity was 0.18% by volume, and the rate of a crystalline phase in a grain boundary phase measured by a powder X-ray diffraction method was 33% by volume.

In order to measure the strength characteristic and toughness of the circuit substrate obtained, three point flexural strength and the maximum deflection amount were measured. The maximum deflection amount was measured by applying load at the central portion of the above circuit substrate in a state that the circuit substrate was supported with a supporting span being 50 mm and measuring the maximum deflection height until the circuit substrate was broken. As a result, three point flexural strength was 64 kgf/mm², and the maximum deflection amount was 1.2 mm.

In order to evaluate joining strength at the joined portion of the copper circuit plate and the silicon nitride ceramic plate, a peel strength test was carried out. Peel strength was measured by joining a tough pitch copper plate having a thickness of 0.3 mm and a width of 3 mm to the silicon nitride ceramic plate on which the intermediate layer was formed, by the same method as described above and peeling the end of the tough pitch copper plate upward in a direction of 90° relative to the substrate by using an Instron tester. A crosshead speed at that time was 50 mm/min. As a result, peel strength was 7.9 kgf/cm, and joining strength was sufficient.

In a thermal cycle resistance test, a process of heating the circuit substrate from −45° C. to room temperature, subsequently heating it from room temperature to +125° C. and then cooling it through room temperature to −45° C. was defined as one cycle, the cycle was applied to the circuit substrate repeatedly, and when the number of cycles until cracks or the like were generated at the substrate portion was evaluated, cracks were not generated at the substrate portion even at the 1,000th cycle.

Figure 3:
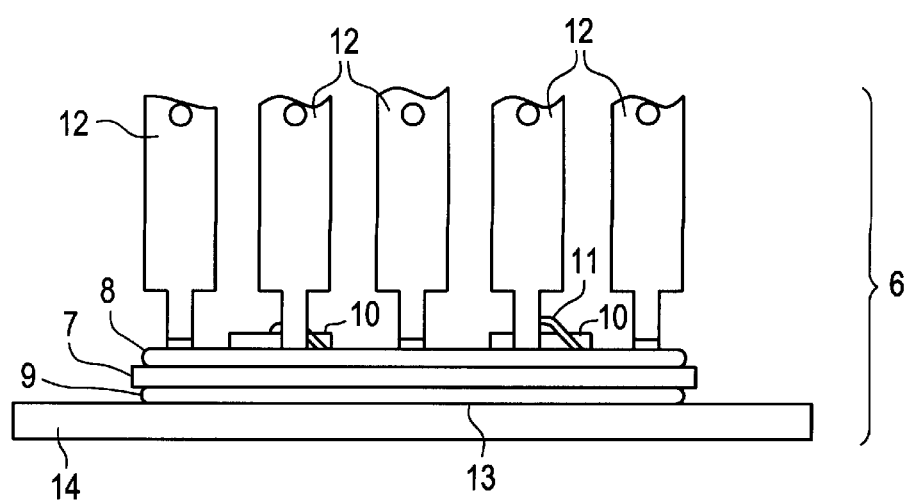
FIG. 3 is a structural view of a semiconductor device utilizing the high thermal conductivity silicon nitride circuit substrate according to the present invention.
Figure 4:
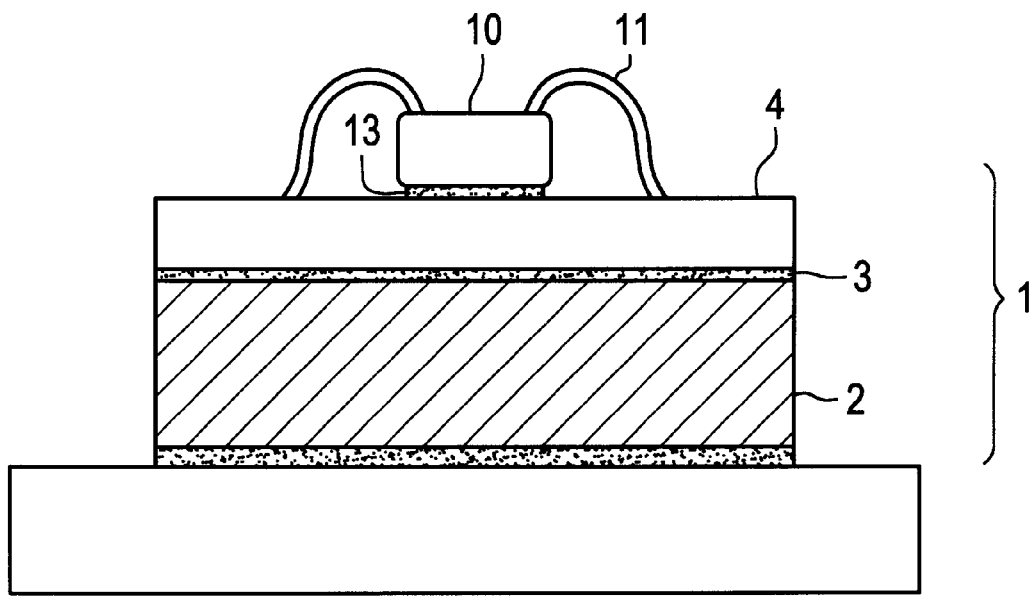
FIG. 4 is a structural view of another semiconductor device utilizing the high thermal conductivity silicon nitride circuit substrate according to the present invention.

On the high thermal conductivity silicon nitride circuit substrate, plural semiconductor elements were mounted to prepare a semiconductor device as shown in FIG. 3. In FIG. 3, 6 is a semiconductor device, 7 is a silicon nitride ceramic plate, 8 is a metal (Cu) circuit plate, 9 is a metal circuit plate (a back Cu plate), 10 is a semiconductor element, 11 is a bonding wire, 12 is a fetch lead terminal, 13 is soldering and 14 is a fetch lead terminal. When transient thermal resistance was measured by passing electricity through the semiconductor device, said device exhibited excellent radiation property which was equivalent to that of a semiconductor device using a conventional aluminum nitride substrate. Further, generation of cracks or the like was not observed at the inner portion of the silicon nitride substrate nor the joined portion of the silicon nitride ceramic plate and the copper plate. Thus, it was confirmed that the silicon nitride substrate had excellent durability and reliability.

Example 2

After procedures to sintering were carried out by the same method as in Example 1, a sintered body was cooled to room temperature by furnace cooling without controlling a cooling process to obtain a dense silicon nitride sintered body having a thermal conductivity of 36 W/m·K. The cooling rate at that time was about 500° C. per hour on average. Thereafter, an intermediate layer of $ZrO_2$ was formed by the same method as in Example 1, and a copper layer was joined by the same method as in Example 1 to prepare a circuit substrate. The three point flexural strength of the silicon nitride circuit substrate obtained was 72 kgf/mm², the maximum deflection amount was 1.1 mm, and in a thermal cycle resistance test, cracks were not generated on the substrate even at the 1,000th cycle.

Example 3

First, a silicon nitride ceramic plate having a thickness of 0.6 mm was obtained by the same method as in Example 1.

Next, an intermediate layer for joining was prepared by the following method. First, aluminum butoxide was dissolved in 2-butanol which was a solvent, and water was diluted with the solvent so that no precipitate was formed in the solution and then added dropwise to the solution to effect partial hydrolysis. Thereafter, concentrated hydrochloric acid was diluted with the solvent and then added dropwise to the solution. The mixture was stirred and refluxed to prepare a coating solution. The above silicon nitride ceramic plate was dipped in the coating solution, pulled up at a rate of 1.5 cm/sec and dried. After the step of dipping and drying was repeated 10 times, the silicon nitride ceramic plate was held at 1,200° C. for 1 hour in nitrogen to form an alumina ($Al_2O_3$) layer having a thickness of 1.2 μm on the silicon nitride ceramic plate.

Next, on both sides of the silicon nitride ceramic plate on which the intermediate layers were formed, copper circuit plates comprising tough pitch copper having a thickness of 0.3 mm were arranged in a contacted state, and the plate was inserted into a belt type heating furnace and subjected to heat treatment at a highest temperature of 1,075° C. for 1 minute in nitrogen atmosphere to join the copper circuit plates to the silicon nitride ceramic plate, whereby a high thermal conductivity silicon nitride circuit substrate as shown in FIG. 1 was obtained.

When the thermal conductivity of the silicon nitride substrate obtained was measured, it was 76 W/m·K, porosity was 0.2% by volume, and the rate of a crystalline phase in a grain boundary phase measured by a powder X-ray diffraction method was 30% by volume.

In order to measure the strength characteristic and toughness of the circuit substrate obtained, three point flexural strength and the maximum deflection amount were measured according to the method of Example 1. As a result, three point flexural strength was 68 kgf/mm$^2$, and the maximum deflection amount was 1.2 mm. As a result of measuring peel strength according to the method of Example 1, a value of 7.4 kgf/cm was obtained, and it was confirmed that sufficient density and strength were exhibited. Further, a thermal cycle resistance test was carried out according to the method of Example 1, cracks were not generated at the substrate portion even at the 1,000th cycle.

On the high thermal conductivity silicon nitride circuit substrate, plural semiconductor elements were mounted to prepare a semiconductor device as shown in FIG. 3. When transient thermal resistance was measured by passing electricity through the semiconductor device, said device exhibited excellent radiation property which was equivalent to that of a semiconductor device using a conventional aluminum nitride substrate. Further, generation of cracks or the like was not observed at the inner portion of the silicon nitride substrate nor the joined portion of the silicon nitride ceramic plate and the copper plate. Thus, it was confirmed that the semiconductor device has excellent durability and reliability.

Example 4

On the silicon nitride ceramic plate obtained in Example 2, an intermediate layer of Al2O3 was formed by the same method as in Example 3, and copper plates were joined by the same method as in Example 3 to prepare a circuit substrate. The three point flexural strength of the silicon nitride circuit substrate obtained was 64 kgf/mm$^2$, the maximum deflection amount was 1.0 mm, and in a thermal cycle resistance test, cracks were not generated on the substrate even at the 1,000th cycle.

Example 5

The same silicon nitride starting powder as in Example 1 was used, dysprosium oxide (Dy2O3) powder having an average particle size of 1.0 μm and alumina ($Al_2O_3$) powder having an average particle size of 0.6 μm as sintering aids were added to the silicon nitride starting powder in amounts of 5% by weight and 0.8% by weight based on the whole amount, respectively, forming and degreasing were carried out by the same method as in Example 1, and then sintering was carried out at 1,930° C. for 6 hours in nitrogen gas at 7 atmospheric pressure. After sintering, a sintered body was cooled to 1,500° C. at a cooling rate of 50° C. per hour and then cooled from 1,500° C. to room temperature by furnace cooling to obtain a dense silicon nitride sintered body. The silicon nitride sintered body was subjected to grinding processing to obtain a silicon nitride ceramic plate having a thickness of 0.5 mm.

The porosity of the silicon nitride ceramic plate obtained was 0.2% by volume, the rate of a crystalline phase in a grain boundary phase was 45% by volume, and thermal conductivity was as high as 84 W/m·K.

Next, an intermediate layer for joining the metal circuit plate was prepared by the following method. First, titanium tetraethoxide (Ti(OEt)$_4$) was dissolved in ethanol which was a solvent, and a mixture obtained by adding water and nitric acid (HNO$_3$) to ethanol was added dropwise to the solution, and the resulting solution was refluxed. Concentrated hydrochloric acid was diluted with the solvent and then added dropwise to the solution. The mixture was stirred and refluxed to prepare a coating solution. The refluxed solution was added to a solution in which a predetermined amount of water was dissolved in ethanol, aluminum isopropoxide (Al(iso-OPr)$_3$) was further added thereto, and the mixture was sufficiently refluxed again. Concentrated hydrochloric acid was diluted with the solvent and then added dropwise to the solution. The mixture was stirred and refluxed to prepare a coating solution. The above silicon nitride ceramic plate was dipped in the coating solution, pulled up at a rate of 1.0 cm/sec and dried. After the step of dipping and drying was repeated 15 times, the silicon nitride ceramic plate was held at 1,200° C. for 1 hour in the air to form a titanium aluminate (TiAl$_2$O$_5$) layer having a thickness of 1.2 μm on the silicon nitride ceramic plate.

Next, on both sides of the silicon nitride ceramic plate on which the titanium aluminate intermediate layers were formed, copper circuit plates comprising tough pitch copper having a thickness of 0.3 mm were arranged in a contacted state, and the plate was inserted into a belt type heating furnace and subjected to heat treatment at a highest temperature of 1,075° C. for 1 minute in nitrogen atmosphere to join the copper circuit plates to the silicon nitride ceramic plate.

In order to measure the strength characteristic and toughness of the circuit substrate obtained, three point flexural strength and the maximum deflection amount were measured by the same method as in Example 1. As a result, three point flexural strength was 84 kgf/mm$^2$, and the maximum deflection amount was 1.3 mm. When peel strength was measured for evaluating the adhesion strength of the copper circuit plate and the silicon nitride ceramic plate, it was a high value of 6.9 kgf/cm.

Further, a thermal cycle resistance test was carried out by the same method as in Example 1, cracks were not generated at the substrate portion even at the 1,000th cycle.

Example 6

Ethyl orthosilicate (Si(OEL)$_4$) was dissolved in ethanol which was a solvent, and a mixture obtained by adding water and nitric acid ($HNO_3$) to ethanol was added dropwise to the solution, and the resulting solution was refluxed. The refluxed solution was added to a solution in which a predetermined amount of water was dissolved in ethanol, aluminum isopropoxide ($Al(iso-OPr)_3$) was further added thereto, and the mixture was sufficiently refluxed again. Concentrated hydrochloric acid was diluted with the solvent and then added dropwise to the solution. The mixture was stirred and refluxed to prepare a coating solution. The silicon nitride ceramic plate obtained in Example 5 was dipped in the coating solution, pulled up at a rate of 1.0 cm/sec and dried. After the step of dipping and drying was repeated 15 times, the silicon nitride ceramic plate was held at 1,200° C. for 1 hour in the air to form a mullite ($3Al_2O_3$—$2SiO_2$) layer having a thickness of 1.2 $\mu$m on the silicon nitride ceramic plate.

Next, on both sides of the silicon nitride ceramic plate on which the intermediate layers were formed, copper circuit plates comprising tough pitch copper having a thickness of 0.3 mm were arranged in a contacted state, and the plate was inserted into a belt type heating furnace and subjected to heat treatment at a highest temperature of 1,075° C. for 1 minute in nitrogen atmosphere to join the copper circuit plates to the silicon nitride ceramic plate.

In order to measure the strength characteristic and toughness of the circuit substrate obtained, three point flexural strength and the maximum deflection amount were measured by the same method as in Example 1. As a result, three point flexural strength was 84 kgf/mm$^2$, and the maximum deflection amount was 1.3 mm. When peel strength was measured for evaluating the adhesion strength of the copper circuit plate and the silicon nitride ceramic plate, it was a high value of 6.9 kgf/cm.

Further, a thermal cycle resistance test was carried out by the same method as in Example 1, cracks were not generated at the substrate portion even at the 1,000th cycle.

Comparative Example 1

On silicon nitride ceramic plates prepared by the same method as in Example 1 except for forming no intermediate layer on one plate and forming an oxidized layer ($SiO_2$) having a thickness of 2 $\mu$m on the surface of the other plate by heating said plate at 1,300° C. for 12 hours in the air, copper circuit plates were joined by the same method as in Example 1, respectively, and each adhesion strength was evaluated by a peel strength test. As a result, to the silicon nitride ceramic plate on which no intermediate layer was formed, the circuit plates could not be joined. On the other hand, in the circuit substrate in which the intermediate layer was a $SiO_2$ layer, peel strength was a low value of 2.7 kgf/cm, whereby said substrate could not be provided for practical use.

Comparative Example 2

By the same method as in Example 1 except for using an aluminum nitride (AlN) substrate having a thickness of 0.6 mm and a thermal conductivity of 70 W/m·K in place of the silicon nitride ceramic plate in Example 1, copper circuit plates were joined by the same method as in Example 1 to prepare a circuit substrate. When the copper circuit plates were joined, an oxidized layer ($Al_2O_3$) formed on the surface of the aluminum nitride substrate by subjecting the substrate to heat treatment in oxygen atmosphere was used as an intermediate layer. Although the peel strength of the circuit substrate obtained was as sufficient as 8.1 kgf/cm, three point flexural strength was 30 kgf/mm$^2$, the maximum deflection amount was 0.4 mm, and in a thermal cycle resistance test, cracks were generated at the 150th cycle. Thus, it was found that the aluminum nitride circuit substrate had a problem in mechanical strength as compared with the silicon nitride circuit substrate.

Examples 7 to 14

Silicon nitride ceramic plates were prepared by the same method as in Example 1. On the surfaces thereof, various compound layers as intermediate layers for joining were formed by using an alkoxide solution according to the same dipping method as in Example 1, respectively. To the surfaces of the intermediate layers, circuit plates of Cu, Al or Ni were joined by utilizing eutectic liquid phases, respectively, to prepare circuit substrates (see Table 1). In the Al circuit plates containing Si element, the highest temperature during joining was set to 585° C., and in the case of the Ni circuit plates containing oxygen, the highest temperature during joining was set to 1,445° C. which was higher than that of the copper circuit plates. The peel strengths of the circuit substrate obtained were evaluated, and a thermal cycle test was carried out to examine reliability. In all of the circuit substrates, the metal circuit plates were firmly joined to the silicon nitride ceramic plates, and even when the thermal cycle test was carried out 1,000 times, cracks or the like were not generated.

TABLE 1

| | Intermediate layer (thickness) | | Metal circuit plate | Peel strength (kgf/cm) | Thermal cycle test (times) |
|---|---|---|---|---|---|
| Example 7 | $HfO_2$ | (2.2 $\mu$m) | Al | 7.4 | >1,000 |
| Example 8 | $ZrAlO_4$ | (1.3 $\mu$m) | Cu | 8.4 | >1,000 |
| Example 9 | $Nb_2O_5$ | (3.2 $\mu$m) | Cu | 6.3 | >1,000 |
| Example 10 | $TiO_2$ | (0.8 $\mu$m) | Ni | 8.7 | >1,000 |
| Example 11 | $Al_2O_3$ | (2.2 $\mu$m) | Al | 7.6 | >1,000 |
| Example 12 | $Y_3Al_5O_{12}$ | (1.3 $\mu$m) | Cu | 8.4 | >1,000 |
| Example 13 | Mullite | (3.0 $\mu$m) | Cu | 6.3 | >1,000 |
| Example 14 | $Al_2O_3$ | (0.8 $\mu$m) | Ni | 7.1 | >1,000 |

Example 15

To silicon nitride starting powder containing 1.7% by weight of oxygen and 0.13% by weight of impurity cationic elements, comprising 93% of α-phase silicon nitride and having an average particle size of 0.6 $\mu$m, holmium oxide ($Ho_2O_3$) powder having an average particle size of 0.7 $\mu$m and $Al_2O_3$ powder having an average particle size of 0.5 $\mu$m as sintering aids were added in amounts of 4% by weight and 1.2% by weight based on the whole amount, respectively. Subsequent procedures to degreasing were carried out by the same method as in Example 1 to obtain a degreased product. Next, after the degreased product was held at 1,880° C. for 8 hours in nitrogen gas atmosphere at 8.1 atmospheric pressure to make it dense, it was cooled by controlling a cooling rate to 1,500° C. of 50° C. per hour and then left Lo stand for cooling to room temperature to obtain a dense silicon nitride sintered body. The sintered body was subjected to grinding processing to obtain a silicon nitride ceramic plate having a thickness of 0.6 mm.

Next, an intermediate layer for joining metal circuit plates to the surface of the silicon nitride ceramic plate was prepared by the following method. The silicon nitride ceramic plate was placed in a sputtering apparatus so that it was opposed to a titanium target, and titanium was sputtered with a partial pressure of Ar being 0.1 Pa and a partial pressure of $O_2$ being 0.2 Pa. Such sputtering was carried out on both sides of the silicon nitride ceramic plate. As a result, $TiO_2$ thin films having a thickness of 1.5 μm and bad crystallinity were obtained on the surface of the silicon nitride ceramic plate.

On both sides of the silicon nitride ceramic plate having the $TiO_2$ thin films on the surface, copper circuit plates comprising tough pitch copper having a thickness of 0.3 mm were arranged in a contacted state, and the plate was inserted into a belt type heating furnace and subjected to heat treatment at a highest temperature of 1,075° C. for 1 minute in nitrogen atmosphere to join the copper circuit plates to the silicon nitride ceramic plate.

The porosity of the silicon nitride substrate obtained was 0.2% by volume, the rate of a crystalline phase in a grain boundary phase was 55% by volume, and thermal conductivity was 96 W/m·K. As a result of measuring three point flexural strength and the maximum deflection amount and carrying out a thermal cycle resistance test and a peel strength test with respect to the circuit substrate to which copper was joined, three point flexural strength was 75 kgf/mm², the maximum deflection amount was 1.1 mm, the result of the thermal cycle resistance test was 1,000 times or more, and peel strength was 8.2 kgf/cm. Thus, all of the values were excellent, and the silicon nitride circuit substrate could be provided for practical use sufficiently.

Example 16

Procedures to degreasing were carried out by the same method as in Example 15 to prepare a silicon nitride degreased product having a thickness of 0.8 mm. Thereafter, the degreased product was dipped in an alkoxide solution prepared for forming an intermediate layer in Example 1 and pulled up quickly. The product was sintered and cooled by the same method as in Example 1 to obtain a dense silicon nitride sintered body having a thickness of 0.6 mm. When distribution of zirconium in the inner portion of the silicon nitride sintered body was examined by Electron Probe Micro Analysis (EPMA), a large amount of Zr was detected in the vicinity of the surface of the sintered body, and only a small amount of Zr was detected in the inner portion of the sintered body. When the sintered body was subjected to heat treatment at 1,300° C. for 12 hours in the air, an oxidized layers having a thickness of about 2.2 μm were formed on the surface of the sintered body. When the structural phase of the oxidized layer was identified by a powder X-ray diffraction method, $ZrSiO_4$ was observed. The copper circuit plates were joined to the resulting plate by the same method as in Example 1 to prepare a circuit substrate.

The porosity of the silicon nitride substrate obtained was 0.2% by volume, the rate of a crystalline phase in a grain boundary phase was 47% by volume, and thermal conductivity was 72 W/m·K. The three point flexural strength of the circuit substrate obtained was 64 kgf/mm², the maximum deflection amount was 1.0 mm, the result of the thermal cycle resistance test was 1,000 times or more, and peel strength was 6.9 kgf/cm. Thus, characteristics as a circuit substrate were good, and the silicon nitride circuit substrate could be provided for practical use sufficiently.

Example 17

An intermediate layer for joining metal circuit plates to the surface of the silicon nitride ceramic plate obtained in Example 15 was prepared by the following method. The silicon nitride ceramic plate was placed in a sputtering apparatus so that it was opposed to an aluminum target, and aluminum was sputtered with a partial pressure of Ar being 0.1 Pa and a partial pressure of $O_2$ being 0.2 Pa. As a result, an amorphous $Al_2O_3$ thin films having a thickness of 1.5 μm were obtained on the surface of the silicon nitride ceramic plate.

On both sides of the silicon nitride ceramic plate having the amorphous $Al_2O_3$ thin films on the surface, copper circuit plates comprising tough pitch copper having a thickness of 0.3 mm were arranged in a contacted state, and the plate was inserted into a belt type heating furnace and subjected to heat treatment at a highest temperature of 1,075° C. for 1 minute in nitrogen atmosphere to join the copper circuit plates to the silicon nitride ceramic plate.

The porosity of the silicon nitride substrate obtained was 0.2% by volume, the rate of a crystalline phase in a grain boundary phase was 55% by volume, and thermal conductivity was 96 W/m·K. As a result of measuring three point flexural strength and the maximum deflection amount and carrying out a thermal cycle resistance test and a peel strength test with respect to the circuit substrate to which copper was joined, three point flexural strength was 68 kgf/mm², the maximum deflection amount was 1.1 mm, the result of the thermal cycle resistance test was 1,000 times r more, and peel strength was 9.2 kgf/cm. Thus, all of he values were excellent, and the silicon nitride circuit substrate could be provided for practical use sufficiently.

Example 18

Procedures to degreasing were carried out by the same method as in Example 15 to prepare a silicon nitride degreased product having a thickness of 0.8 mm. Thereafter, the degreased product was dipped in an alkoxide solution prepared for forming an intermediate layer in Example 3 for several seconds and pulled up quickly. The product was sintered and cooled by the same method as in Example 15 to obtain a dense silicon nitride sintered body having a thickness of 0.6 mm. When the structural phase of the surface of the silicon nitride sintered body was identified by a powder X-ray diffraction method, it was observed that a small amount of silicon nitride and a large amount of SIALON existed. When distribution of aluminum in the inner portion of the silicon nitride sintered body was examined by EPMA, a large amount of Al was detected in the vicinity of the surface of the sintered body, and only a small amount of Al was detected in the inner portion of the sintered body. When the sintered body was subjected to heat treatment at 1,300° C. for 12 hours in the air, an oxidized layer having a thickness of about 2.2 μm was formed on the surface of the sintered body. When the structural phase of the oxidized layer was identified by a powder X-ray diffraction method, a small amount of $SiO_2$ and a large amount of mullite were observed. The resulting plate was used as a circuit substrate, and copper circuit plates were joined by the same method as in Example 1 to prepare a circuit substrate.

The porosity of the silicon nitride substrate obtained was 0.2% by volume, the rate of a crystalline phase in an grain boundary phase was 47% by volume, and thermal conductivity was 72 W/m·K. The three point flexural strength of the circuit substrate obtained was 64 kgf/mm², the maximum deflection amount was 1.0 mm, the result of the thermal cycle resistance test was 1,000 times or more, and peel strength was 6.9 kgf/cm. Thus, characteristics as a circuit substrate were good, and the silicon nitride circuit substrate could be provided for practical use sufficiently.

We claim:

1. A high thermal conductivity silicon nitride circuit substrate which comprises:

a silicon nitride ceramic plate having a thermal conductivity at 25° C. of 60 W/m·K or more, which contains a rare earth element in an amount of 1.0 to 12.5% by weight calculated on oxide, and contains lithium, sodium, potassium, iron, calcium, magnesium, strontium, barium, manganese and boron in a total amount of 0.3% or less by weight as impurity cationic elements; and a metal circuit plate joined to the silicon nitride ceramic plate through an intermediate layer containing oxygen and at least element selected from the group consisting of titanium, zirconium, hafnium and niobium.

2. The substrate according to claim 1, wherein the silicon nitride ceramic plate comprises silicon nitride particles and a grain boundary phase, and a crystalline compound phase which exists in the grain boundary phase has a volume which corresponds to 20% or more of the whole grain boundary phase.

3. The substrate according to claim 1, wherein the intermediate layer has a thickness of 0.5 to 10 μm.

4. The substrate according to claim 1, wherein the metal circuit plate comprises copper, aluminum or nickel.

5. A high thermal conductivity silicon nitride circuit substrate which comprises:

a silicon nitride ceramic plate having a thermal conductivity at 25° C. of 60 W/m·K or more which contains a rare earth element in an amount of 1.0 to 12.5% by weight calculated on oxide, and contains lithium, sodium, potassium, iron, calcium magnesium strontium. barium. manganese and boron in a total amount of 0.3% or less by weight as impurity cationic elements; and a metal circuit plate joined to the silicon nitride ceramic plate through an intermediate layer containing aluminum oxide.

6. The substrate according to claim 5, wherein the silicon nitride ceramic plate comprises silicon nitride particles and a grain boundary phase, and a crystalline compound phase which exists in the grain boundary phase has a volume which corresponds to 20% or more of the whole grain boundary phase.

7. The substrate according to claim 5, wherein the intermediate layer has a thickness of 0.5 to 10 μm.

8. The substrate according to claim 5, wherein the metal circuit plate comprises copper, aluminum or nickel.

* * * * *